United States Patent [19]
Lim

[11] Patent Number: 6,013,947
[45] Date of Patent: *Jan. 11, 2000

[54] SUBSTRATE HAVING GATE RECESSES OR SLOTS AND MOLDING DEVICE AND MOLDING METHOD THEREOF

[75] Inventor: Hong Woo Lim, Inchon, Rep. of Korea

[73] Assignee: Trimecs Co., Ltd., Inchon, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/986,929

[22] Filed: Dec. 8, 1997

[30] Foreign Application Priority Data

Jun. 27, 1997 [KR] Rep. of Korea ...................... 97-28254

[51] Int. Cl.[7] .............................. H01L 23/02; H01L 23/28
[52] U.S. Cl. .......................... 257/685; 257/782; 257/787; 264/272.17
[58] Field of Search ..................................... 257/666, 670, 257/712, 722, 787, 796, 685, 795; 264/272.17

[56] References Cited

U.S. PATENT DOCUMENTS

| | | | |
|---|---|---|---|
| 5,371,044 | 12/1994 | Yoshida et al. | 264/272.17 |
| 5,430,331 | 7/1995 | Hamzehdoost et al. | 257/796 |
| 5,612,576 | 3/1997 | Wilson et al. | 257/787 |
| 5,635,671 | 6/1997 | Freyman et al. | 257/787 |

*Primary Examiner*—Wael Fahmy
*Assistant Examiner*—William David Coleman
*Attorney, Agent, or Firm*—Bacon & Thomas PLLC

[57] ABSTRACT

The invention relates to a substrate having gate recesses or slots for the flow of molding resin, and related molding device and molding method in which said substrate is used. According to the invention, there is provided a substrate 10 having a multitude of chip pads 20 for mounting semiconductor chips, characterized in that gate recesses or slots 30 are formed along the resin routes 102 below the surface of the substrate 10 corresponding to the gate of mold 70, and the gate slots 30 extend from the edge of substrate 10 to the near part of the molded package 101.

And according to the invention, the molding device and molding methods which properly use the gate recesses or slotted substrate 10 are provided.

4 Claims, 5 Drawing Sheets

(a)

(b)

SUBSTRATE HAVING GATE RECESSES OR SLOTS AND MOLDING DEVICE AND MOLDING METHOD THEREOF

FIELD OF THE INVENTION

The invention relates to a substrate for semiconductor package, and more particularly to a substrate having gate recesses or slots for the flow of molding resin, and related molding device and molding method in which said substrate is used.

BACKGROUND OF THE INVENTION

A general process for manufacturing the semiconductor chip packages includes a chip mounting step in which semiconductor chips are mounted on a substrate, a molding step in which semiconductor chips are molded with a molding resin to protect the electric connection between semiconductor chips and the substrate and a cutting step in which the molded semiconductor chips are cut into individual chips. In case of the ball grid array type semiconductor, the substrate is made by laminating a plurality of thin resin sheets on which circuit patterns are laid.

FIG. 1 shows the conventional substrate and FIG. 2 shows the conventional resin forming molds. On the surface of the substrate 100, there are provided a plurality of chip pads 20 for mounting semiconductor chips 103, and on one sides of respective chip pad 20, there are provided with resin routes 102 through which molding resin may flow. After the semiconductor chips 103 are bonded on the substrate 100, the substrate 100 is placed between the upper mold 70 and the lower mold 72, then molding resin 82 is injected by plunger 84 into the cavity 74 of molds 70, 72, whereby the semiconductor chip package is made.

But, when the resin flows along the resin routes 102, some of the resin remains and is attached on the resin routes 102 after the resin hardens. As the remaining resin may cause the defect of semiconductor chip packages, a removing process of the remaining resin(degating process) is required. When the remaining resin is removed from the resin routes 102 of the substrate 100, the inter-layer peeling may take place. In order to solve this problem, there has been provided substrates wherein a gold or other metal is plated on the resin routes 102, which make it possible to remove remaining resin easily.

However, for the gold plating of substrate, plating equipments and manpower are required, which results in higher cost of semiconductor chip packages.

SUMMARY OF THE INVENTION

The invention has the object to solve the above mentioned problems by providing a substrate having gate recesses or slots, which can achieve the cost reduction and the improvement of productivity in a semiconductor molding process.

The invention also has the object to provide a semiconductor package molding device and the molding method which could use said gate recessed or slotted substrate.

According to the invention, there is provided a substrate 10 having a multitude of chip pads 20 for mounting semiconductor chips, characterized in that gate recesses 30 are formed along the resin routes 102 below the surface of the substrate 10 corresponding to the gate of mold 70, and said gate recesses 30 extend from the edge of substrate 10 to the near part of the molded package 101.

According to another aspect of the invention, said gate recesses 30 are shaped as rectangle, slim circle or ellipse.

According to the invention, there is also provided a semiconductor package molding device for molding the semiconductor chips 103 on the substrate 10 having the gate recesses 30, characterized in that the gate of mold is devided into the first gate 50 which is positioned to the side of resin pot 78 or the runner 80 and the second gate 60 which is positioned to the side of cavity 74 of molds, and between the first gate 50 and the second gate 60 are provided the gate shut-off portion 76 which faces said gate recess 30 of substrate 10.

According to the invention, there is also provided a semiconductor package molding method which includes the step of die bonding in which semiconductor chips 103 are bonded on the chip pads 20 of substrate 10 having the gate recesses 30, the step of wire bonding in which the semiconductor chip 103 and the substrate 10 are electrically contacted, the step of mold clamping in which the substrate 10 is placed on the molds 70, 72 which have the first gate 50 opened to the resin pot 78 or runner 80, the second gate 60 opened to the cavity 74 of molds and the gate shut-off portion 76 between said first gate 50 and second gate 60, the step of resin injecting in which the resin flows from the resin pot 78 through the first gate 50 and the gate recess 30 and the second gate 60 in sequence finally into the cavity 74, the step of solder ball bonding in which the solder balls 40 are bonded on the bottom surface of substrate 10 and the step of cutting in which the substrate 10 is cut into the individual semiconductor chips with omitting the step of degating.

DETAILED DESCRIPTION OF THE INVENTION

A preferred embodiment of the invention will be described by referring to the accompanying drawings.

Figure 1:
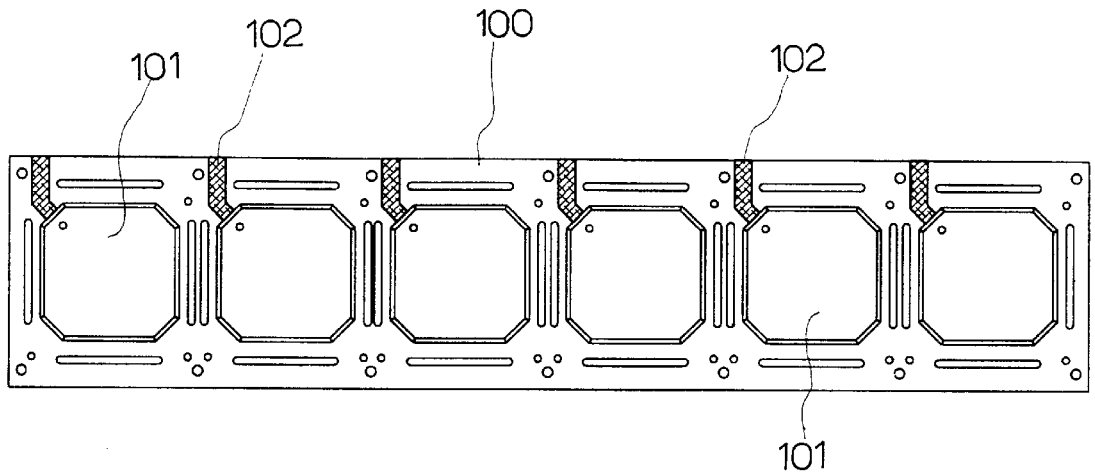
FIG. 1 is a plan of a conventional substrate.
Figure 2:
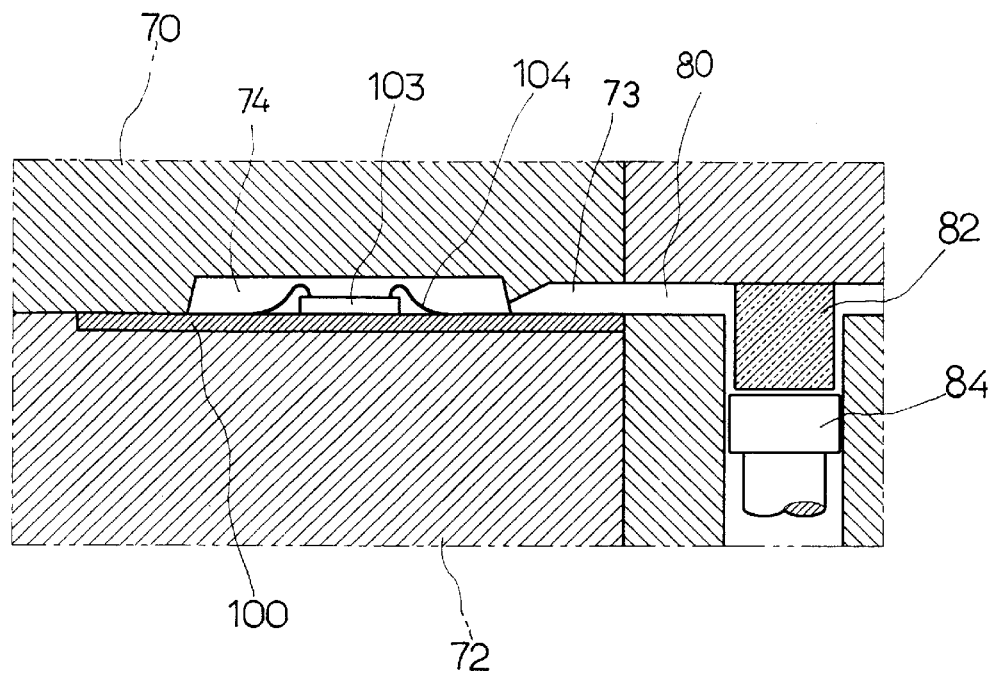
FIG. 2 is a section of a conventional semiconductor package molds.
Figure 3:
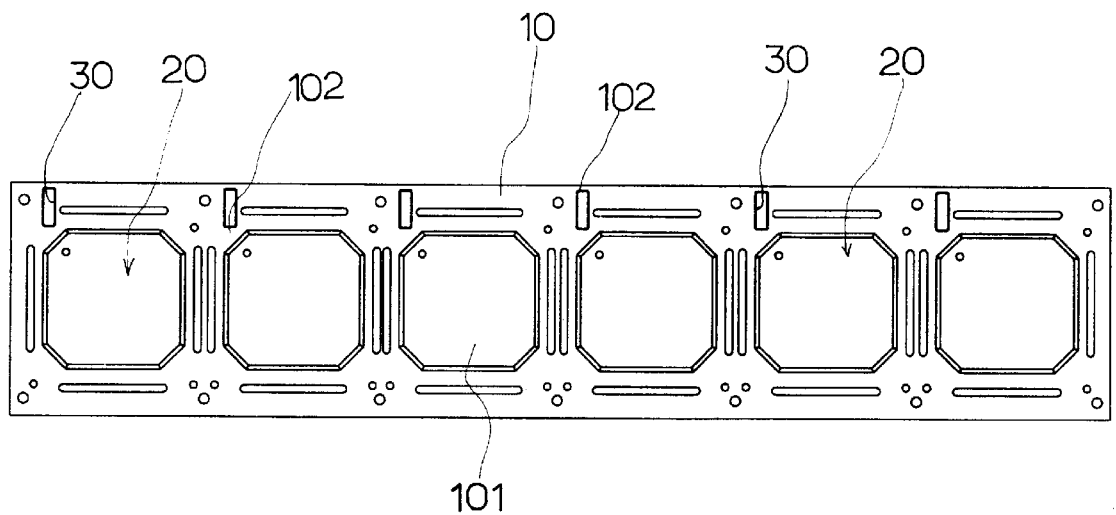
FIG. 3 is a plan of a substrate according to an embodiment of the invention.

As shown in FIG. 3, on top of a substrate 10, which was formed by adhering multiple layers of thin resin sheets to a predetermined thickness, there are provided chip pads 20 so that a multitude of semiconductor chips may be attached on them, and at one side of the respective chip pads 20, gate recesses 30 are punched along the resin routes 102 in such a manner that the gate recesses extend completely through the substrate 10 so as to form slots are positioned at uniform intervals along a peripheral edge of the substrate 10. The inner end of the gate slot 30 extends to near the chip pad 20, but it does not extend into the molded package 101. Therefore, if the substrate 10 is clamped between the upper mold 70 and lower mold 72, the melted resin may flow from the first gate 50 formed on the outer part of molds, through the gate slot 30 formed on the substrate 10, to the second gate 60 formed on the inner part of molds.

Figure 9:
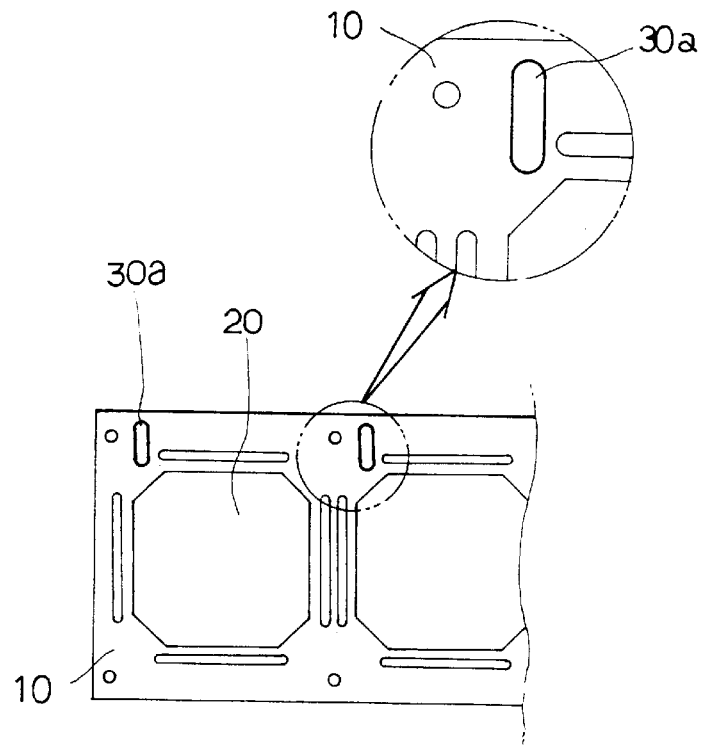
FIGS. 9a and 9b are partial views showing various types of gate recesses.
Figure 9:
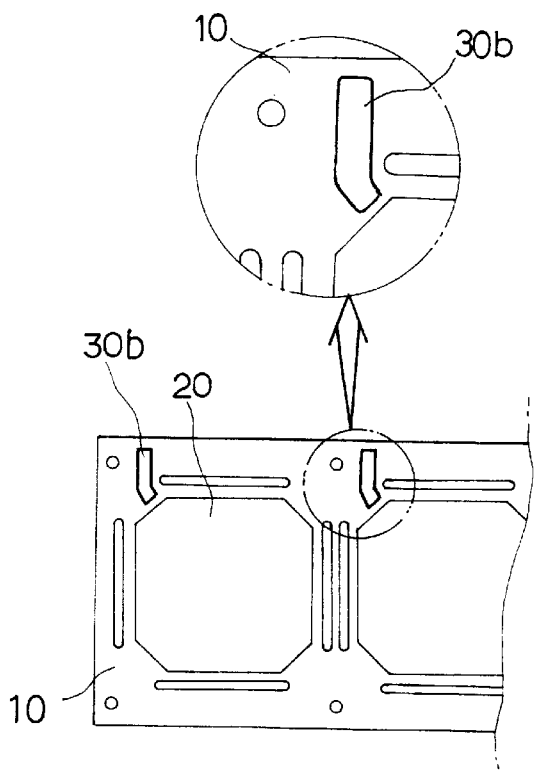

The gate slots 30 may be formed in the shape of a rectangle, slim circle, ellipse or bent or curved slot or any other proper shapes which can constitute resin path. FIG. 9 illustrates a gate slot 30a of a slim circle and a gate slot 30b of a bent contour respectively for instance.

Figure 4:
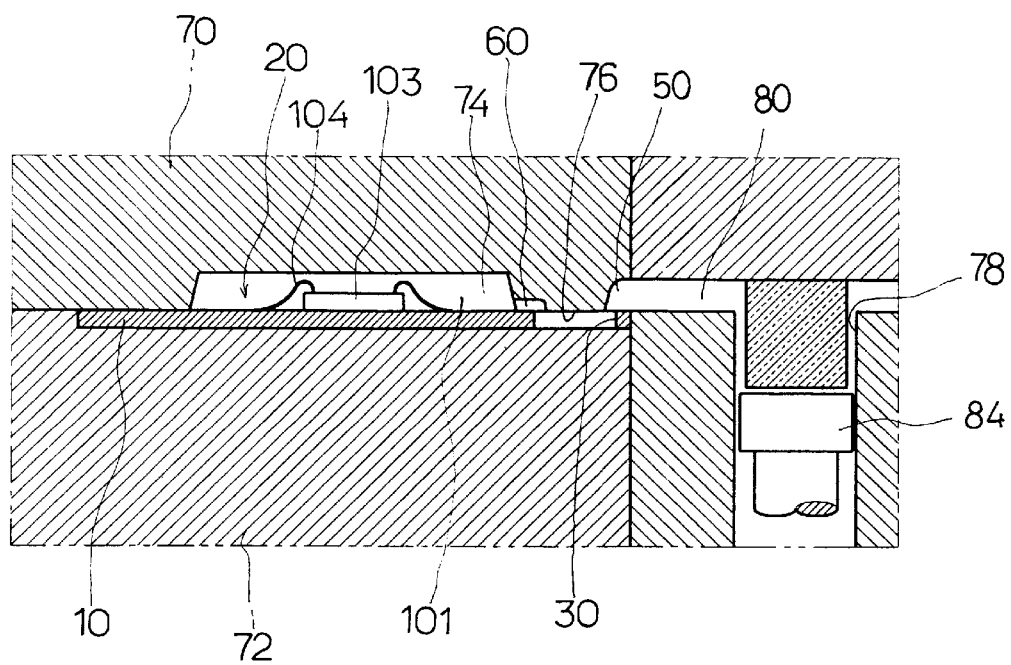
FIG. 4 is a section of semiconductor package molds according to the invention.
Figure 5:
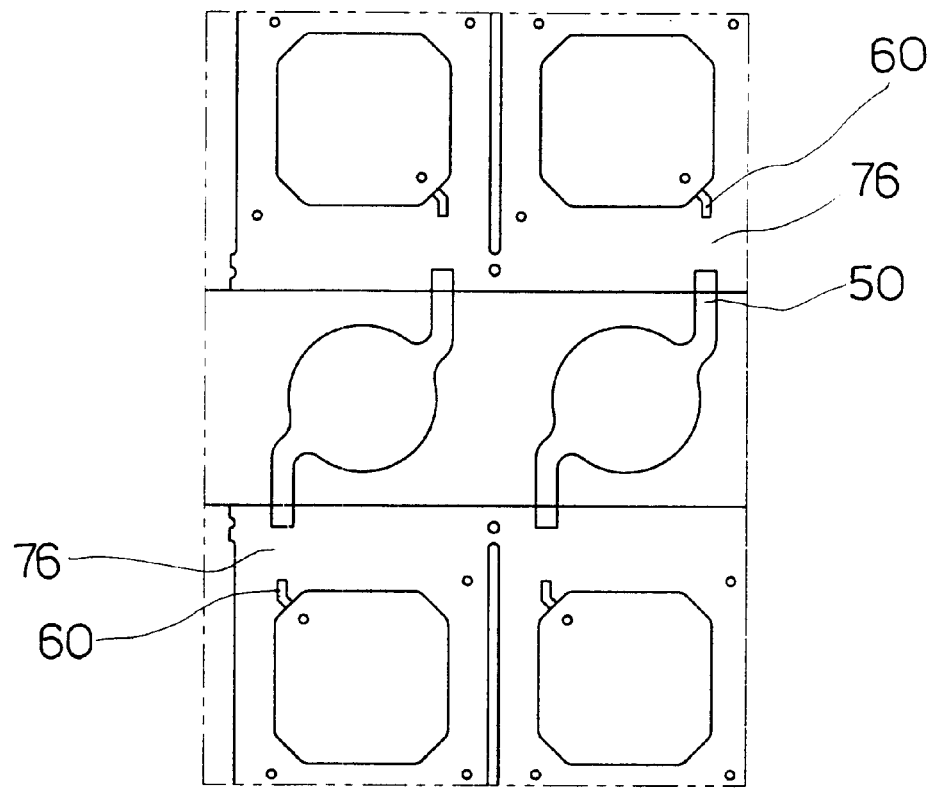
FIG. 5 is a schematic bottom view of the upper mold according to the invention.

Referring to FIG. 4 and FIG. 5, the gate of the molds according to the invention is divided into the first gate 50 and the second gate 60. The first gate 50 is positioned on the side of resin pot 78 or runner 80, and the second gate 60 is positioned on the side of cavity 74 of molds. Between the first gate 50 and the second gate 60, there are provided a gate shut-off portion 76 which extends to the bottom surface of the upper mold 70. The gate shut-off portion 76 is shaped to face and contact with the gate slot 30 of the substrate 10 placed on the lower mold 72. According to the structure of the molds as mentioned above, the flow of the melted resin which have passed the first gate 50 should be blocked by the gate shut-off portion 76, then it will bypass through the gate slot 30 and pass the second gate 60 and it will finally enter into the cavity 74.

Figure 6:
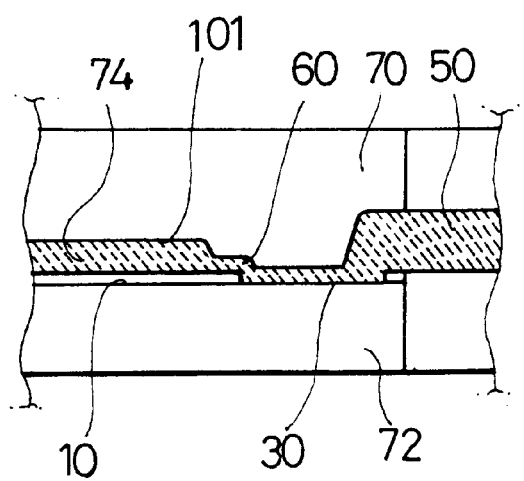
FIG. 6 is a partial view of the molds according to the invention in which resin is filled.
Figure 7:
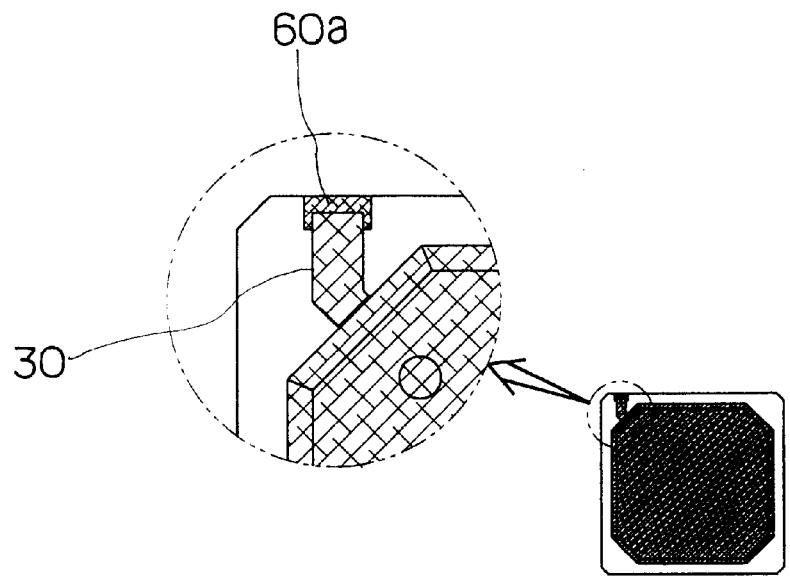
FIGS. 7 and 8 show the individual semiconductor package which are made by the invention.
Figure 8:
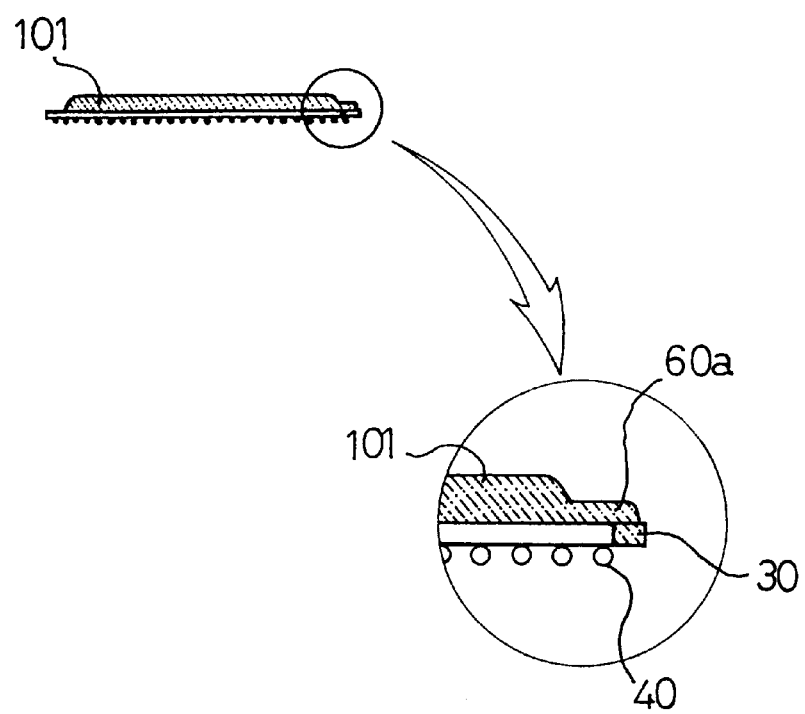

FIG. 6 shows that the cavity 74 and the gate portion 50, 30 and 60 are filled with resin. FIG. 7 and FIG. 8 show the individual semiconductor chip package in which, after being molded by using the gate-slotted substrate and the molds of the invention and the solder balls 40 being bonded on the bottom surface of the substrate 10, the peripheral frame of the substrate 10 has been cut away.

Particularly, the resin remaining in the first gate 50 and in the major part of gate slot 30 should be removed in the step of cutting individual chips and the residual resin 60a in the second gate 60 is not removed. But it is small enough to cause no trouble in subsequent processes or its use. Therefore, the degating process of removing the residual resin from the substrate 10 could be completely omitted, which will achieve the reduction of process and cost down.

As explained above, according to the invention, the process of gold plating or other treatments on resin routes of the substrate could be unnecessary and omitted in the semiconductor package molding process by way of simply providing gate slots on the substrate, and simply changing the molds structure, so that the process for producing semiconductors package can be remarkably improved to thereby increase productivity.

What is claimed is:

1. A substrate (10) comprising:
   a plurality of chip pads (20) disposed on a surface of the substrate (10) for mounting semiconductor chips;
   a plurality of resin routes (102) defined on the surface of the substrate (10) so as to correspond to a gate of a mold; and
   a gate recess (30) formed along each of the resin routes (102) and extending below the surface of the substrate, each of the gate recesses (30) extending from near an edge of the substrate (10) to near a respective one of the chip pads (20).

2. The substrate (10) according to claim 2, wherein the gate recesses (30) are formed in a shape selected from the group consisting of a rectangle, a slim circle, and an ellipse.

3. The substrate (10) according to claim 1, wherein the gate recesses (30) extend completely through the substrate (10) so as to form gate slots.

4. The substrate (10) according to claim 3, wherein the gate slots (30) are formed in a shape selected from the group consisting of a rectangle, a slim circle, and an ellipse.

* * * * *